(12) United States Patent
Suelzle et al.

(10) Patent No.: US 11,500,002 B2
(45) Date of Patent: Nov. 15, 2022

(54) METHOD FOR DETERMINING AN ELECTRICAL VARIABLE

(71) Applicant: Robert Bosch GmbH, Stuttgart (DE)

(72) Inventors: Helmut Suelzle, Pleidelsheim (DE); Juergen Motz, Steinheim an der Murr (DE); Patrick Lueckel, Stuttgart (DE); Quang-Minh Le, Hemmingen (DE)

(73) Assignee: Robert Bosch GmbH, Stuttgart (DE)

( * ) Notice: Subject to any disclaimer, the term of this patent is extended or adjusted under 35 U.S.C. 154(b) by 69 days.

(21) Appl. No.: 17/109,768

(22) Filed: Dec. 2, 2020

(65) Prior Publication Data

US 2021/0181244 A1   Jun. 17, 2021

(30) Foreign Application Priority Data

Dec. 17, 2019   (DE) .......................... 102019219840.6

(51) Int. Cl.
  *G01R 27/16*   (2006.01)
  *B60R 16/03*   (2006.01)
(52) U.S. Cl.
  CPC .............. *G01R 27/16* (2013.01); *B60R 16/03* (2013.01)
(58) Field of Classification Search
  CPC ........ G01R 27/16; G01R 31/00; G01R 27/02; B60R 16/03
  See application file for complete search history.

(56) References Cited

U.S. PATENT DOCUMENTS

| | | | | |
|---|---|---|---|---|
| 2003/0230439 | A1* | 12/2003 | Bisaro .................. | B60K 5/1283 180/65.225 |
| 2015/0224845 | A1* | 8/2015 | Anderson ............ | B60G 17/052 701/37 |
| 2015/0326038 | A1* | 11/2015 | Lee ......................... | H02J 7/007 320/134 |
| 2018/0366750 | A1* | 12/2018 | Braillard ............... | H01M 8/043 |

* cited by examiner

*Primary Examiner* — Alvaro E Fortich
*Assistant Examiner* — Zannatul Ferdous
(74) *Attorney, Agent, or Firm* — Norton Rose Fulbright US LLP; Gerard Messina

(57) ABSTRACT

A method for determining an electrical variable of a component of part of a vehicle electrical system including at least one external current and an electrical impedance unit. A measuring unit is configured to generate a plurality of current and voltage values for each of at least two different operating points of the impedance unit. The method includes: providing the current values of the impedance unit at a first operating point and at least one second operating point; providing the voltage values of the impedance unit at a first operating point and at least one second operating point; corresponding current and voltage values being associated with one another; determining the at least one electrical variable of the component based on a parameter estimation method and an electrical model of the part of the vehicle electrical system and at least part of the corresponding current and voltage values.

16 Claims, 2 Drawing Sheets

US 11,500,002 B2

METHOD FOR DETERMINING AN ELECTRICAL VARIABLE

CROSS REFERENCE

The present application claims the benefit under 35 U.S.C. § 119 of German Patent Application No. DE 102019219840.6 filed on Dec. 17, 2019, which is expressly incorporated herein by reference in its entirety.

FIELD

The present invention relates to a method for determining an electrical variable of at least one component of a part of a vehicle electrical system, the part of the vehicle electrical system including at least one external current.

BACKGROUND INFORMATION

In modern vehicles, essential functions, for example, the steering, the braking system, or the surroundings detection, are dependent on a reliable vehicle electrical system supply. This applies in particular to at least semi-automated mobile platforms. It is indispensable to monitor the electrical supply of safety-relevant consumers and ensure that in the event of a system failure, the mechanical fallback level is not possibly available to the driver to avoid an emergency situation.

Against this background, it is necessary to monitor and possibly diagnose the vehicle electrical system and its components. Individual components are typically checked with the aid of a corresponding number of sensors.

Vehicles having automated driving functions generally have a redundantly designed dual voltage vehicle electrical system among the two channels of which the safety-relevant consumers are divided in order to be able to produce an emergency operation in the event of failure of one channel.

SUMMARY

In order that assemblies, for example the braking system, and the mentioned fallback systems may be operated safely and reliably, a particularly elevated availability requirement is placed on the vehicle electrical system of such a vehicle.

A vehicle electrical system of vehicles includes electrical resistors due to, for example, electrical lines or contacts.

If a current flows through such resistors, a voltage drop occurs via the resistors and the terminal voltage available to a consumer or a load sinks. The voltage drop at these resistors also increases with the level of the current through these resistors. Due to the required power and the comparatively low voltage in a vehicle electrical system, very high currents flow, so that this effect is essential for the function of connected electrical loads, for example electrical assemblies.

The resistance of such a supply line is understood here in the sense that all resistors which reduce the terminal voltage at the end of the supply line, to which a load is connected, are combined to form a value or a sum if not described otherwise. This thus also includes contact resistances and ground connections.

If, due to the voltage drop across at least parts of the supply line, an excessively low voltage is applied at the connection terminals of such assemblies, it is possible that all functions of the assemblies may no longer be maintained if such a voltage drop sinks below a shutdown threshold of the assembly. Otherwise, a resulting performance of the assemblies may be restricted due to the lower voltage.

The measurement of the voltage of the vehicle electrical system alone is not sufficient to predict the performance of the electrical power supply, in particular due to resistances in a supply line, since the maximum power is seldom demanded during normal operation.

In this entire description of the present invention, the sequence of method steps is represented in such a way that the method is easily comprehensible. However, those skilled in the art will recognize that it is also possible to pass through many of the method steps in a different sequence and have the same or a corresponding result. The sequence of the method steps may be changed accordingly in these terms.

A mobile platform may be understood as an at least semi-automated system, which is mobile, and/or as a driver assistance system of a vehicle. An example may be an at least semi-automated vehicle or a vehicle having a driver assistance system. That means, in this context, an at least semi-automated system includes a mobile platform with respect to an at least semi-automated functionality, but a mobile platform also includes vehicles and other mobile machines including driver assistance systems. Further examples of mobile platforms may be driver assistance systems including multiple sensors, mobile multisensor robots, for example, robot vacuum cleaners or lawnmowers, a multisensor monitoring system, a manufacturing machine, a personal assistant, or an access control system. Each of these systems may be a completely or semi-automated system.

The described method may be used for such an at least semi-automated mobile platform.

According to one aspect of the present invention, a method is provided for determining an electrical variable of at least one component of a part of a vehicle electrical system, a method for activation, an evaluation unit, a device, a computer program, and a machine-readable memory medium according to the features of the independent claims. Advantageous embodiments of the present invention are described herein.

According to one aspect of the present invention, a method is provided for determining an electrical variable of at least one component of a part of a vehicle electrical system, the part of the vehicle electrical system including at least one external current. The part of the vehicle electrical system includes an electrical impedance unit, and a measuring unit is designed for the part of the vehicle electrical system to generate a plurality of current and voltage values for each of at least two different operating points of the impedance unit. In accordance with an example embodiment of the present invention, in one step, the method provides the particular plurality of current values of the impedance unit at a first operating point and at least one second operating point. In a further step, the particular plurality of voltage values of the impedance unit at a first operating point and at least one second operating point is provided, corresponding current and voltage values being associated with one another. In a further step, the at least one electrical variable of the at least one component is determined based on a parameter estimation method and an electrical model of the part of the vehicle electrical system and at least a part of the plurality of the corresponding current and voltage values of at least two operating points of the impedance unit.

The external current is a current in the part of the vehicle electrical system which influences the determination of the electrical variable, but is not measured or cannot be measured.

The electrical variable may be the value of a component of the part of the vehicle electrical system, such as an impedance, a resistance, a capacitance, a voltage, a battery voltage, a generator voltage, or another electrical variable of a component of the part of the vehicle electrical system. The part of the vehicle electrical system is composed of such components and their particular electrical connections with their contact wires and line wires. In this context, the electrical connections are also considered to be a component of the part of the vehicle electrical system. The impedance unit may assume different values or have different operating points. The measuring unit, which measures the voltage via the impedance unit and/or the current which flows through the impedance unit, may determine in each case a plurality of values of the voltage or the current at the different operating points and possibly provide them for further steps of the method. This may take place, for example, in that the values which the measuring unit determines are buffered and/or provided directly, for example to an evaluation unit. In particular, operating points may differ due to the current which flows through the impedance unit.

Current and voltage values correspond when they have been measured at the same impedance unit at the same time in such a way that they may characterize an impedance state of the impedance unit.

The fact that the determination of the at least one electrical variable of the at least one component is based on a parameter estimation method and an electrical model is to be understood broadly, in that any determination of the electrical variable, and any intermediate step for determining the electrical variable with the aid of a parameter estimation method, is to be understood as based on a parameter estimation method. This also applies accordingly to the electrical model of the part of the vehicle electrical system. As explained below, the parameter estimation method includes a plurality of different methods which are based on the electrical model and statistical relationships of the plurality of the determined voltage or current values.

The electrical model of the part of the vehicle electrical system describes a functional relationship of the electrical variables of the components of the part of the vehicle electrical system and current or voltage values which may be determined at the electrical components or at the impedance unit.

The parameter estimation method may be a recursive method in which a starting value for the electrical variable and a spread of the electrical variables are established prior to the recursive steps of the method.

It is possible to run through the following steps recursively until a predefined abortion criterion is met:
  determining a state prediction of the electrical variable;
  determining a prediction of the error covariance of the electrical variable;
  estimating the electrical variable using a Kalman method;
  estimating the error covariance of the electrical variable using a Kalman method.

The predefined abortion criterion may be met when a number of recursions have been run through or the error covariance is less than a predefined limit.

In branched vehicle electrical systems, it is often not possible to detect errors due to an absence of measuring points or sensors, in particular because there are no values of external currents, which are not measured. A corresponding model which describes the vehicle electrical system is thereby under-determined. By using chronological correlations with the aid of a parameter estimation method, electrical variables may be estimated in such a vehicle electrical system, because the chronological correlation results in further functional relationships for determining the resistances, since the electrical values of the components typically remain constant.

In addition, if parameter estimation methods are used, an influence of sensor measuring errors is minimized in order to improve the determination of electrical variables of components of the part of the vehicle electrical system, for example the estimation accuracy of transition and line resistances, and thus to improve a diagnosis quality of the system.

In particular, wiring harness resistances, i.e., supply line resistivities to components of the part of the vehicle electrical system, may be determined using this method.

According to one aspect of the present invention, it is provided that the at least two operating points are determined during normal operation of the part of the vehicle electrical system. For example, the impedance unit may be provided in the form of a service brake, and the at least two operating points may be determined during normal operation of the at least semi-automated platform during an actuation of the service brake. By actuating the braking unit at different strengths, the braking unit passes through a plurality of operating points.

Using the example method, for example, a performance of at least one supply line of an assembly may be tested, the safe and reliable functionality of which is essential for a planned maneuver of the mobile platform, or a secondary assembly may be tested, which is provided as a fallback level in case of a defect of the assembly.

a) Measurement of $I_{Mot}$ and $I_{Vent}$ may be carried out directly by a shunt
b) or calculated by back-calculation from the phase currents of the EC motor used for excitation.

According to one aspect of the present invention, it is provided that the impedance unit corresponds to an assembly, and the assembly is activated in a test mode using pulsed currents without inducing a mechanical effect to the outside.

With the aid of such a test mode, in which the assembly is activated using pulsed currents, a very accurately defined current may be applied to a supply line in the at least two operating points. This yields the advantage of being able to assess the vehicle electrical system behavior in an even more defined manner.

According to one aspect of the present invention, it is provided that the assembly is a service brake of the mobile platform and the application of the defined current to the supply line of the electrically operated service brake is achieved by operating the service brake with activation of a brake functionality of the mobile platform.

In this way, on the one hand, the performance of the supply line may be checked and, in addition, the activation of the brake functionality may initiate a subsequent maneuver. In this way, in particular a supply line may be checked with the aid of an electromechanical braking unit.

According to one aspect of the present invention, it is provided that the vehicle electrical system includes at least one first part and one second part having particular electrical components, and at least one electrical component is associated both with the first part and with the second part of the vehicle electrical system, and both the first part and the second part of the vehicle electrical system each have a measuring device, which generates a plurality of current and voltage values of the electrical impedance unit at each of at least three different operating points at the particular measuring unit. In one step, the particular plurality of current values of the impedance unit is provided at a first, second, and at least third operating point for the particular measuring unit. In a further step, the particular plurality of voltage values of the impedance unit is provided at a first, second, and at least third operating point for the particular measuring unit, corresponding current and voltage values being associated with one another. In a further step, the electrical variable of the at least one component is determined in at least one of the parts of the vehicle electrical system, the determination being based on a modified parameter estimation method and modified electrical model of the parts of the vehicle electrical system and at least a part of the plurality of corresponding current and voltage values from the at least three operating points.

Partial wiring harnesses including the resistances may thus also be diagnosed separately from one another with the aid of the additional measured variable.

According to one aspect of the present invention, it is provided that the parameter estimation method is based on a Kalman filter, an extended Kalman filter, an unscented Kalman filter, a recursive least-squares method, or a particle filter.

Due to the different options for implementing parameter estimation methods, the particular suitable parameter estimation method may be used.

According to one aspect of the present invention, it is provided that the at least one component is a supply line resistivity of the impedance unit.

Even if external currents are present in the part of the vehicle electrical system, transfer resistances which result from line and contact resistances between the components of the part of the vehicle electrical system may thus also be determined or estimated.

According to one aspect of the present invention, it is provided that the impedance unit is an electrical load of the vehicle electrical system.

A very normal load may thus also assume different operating points, for example during normal operation, as the impedance unit and thus ensure the possibility of determining an electrical variable of a component of the part of the vehicle electrical system.

According to one aspect of the present invention, it is provided that the impedance unit is controlled in the particular operating points to determine the electrical variable of the at least one component of the part of the vehicle electrical system.

Because certain operating points of the impedance unit are intentionally approached, the electrical variable of a component may be determined very accurately. An active diagnosis using specially optimized excitations to improve the estimation quality is also conceivable, if these do not negatively affect the operation of the vehicle electrical system. A redundant channel is predestined for this purpose.

According to one aspect of the present invention, it is provided that the impedance unit is operated at an operating point at which the current through the impedance unit is very small in order to determine an estimation of a source voltage, in particular of a battery and/or another current source.

According to one aspect of the present invention, it is provided that if a source voltage determined using the described method with the aid of the parameter estimator is less than a predefined limiting value, a warning to a driver and/or a control of the mobile platform takes place.

According to one aspect of the present invention, it is provided that the electrical variable of the vehicle electrical system is transmitted to a central evaluation unit for monitoring the at least one component.

Electrical variables of components determined individually by assemblies or other subunits of the vehicle electrical system may thus be centrally recorded and monitored. A diagnosis of the vehicle electrical system is thus possible in particular in order to ensure an adequate supply of assemblies of the vehicle electrical system. In particular, such a diagnosis may relate to safety-relevant assemblies or systems, for example, a braking system, a steering, a surroundings detection unit, or a control computer.

According to one aspect of the present invention, it is provided that safety-critical assemblies or systems are deactivated due to a result of such a diagnosis if the values exceed or fall below predefined limiting values.

According to one aspect of the present invention, it is provided that the electrical variable of the at least one component is detected and stored to identify a trend in the course of a change of an electrical variable.

Using such a trend, it is possible to predict failures of the electrical system, in particular due to line resistances which are greater than a predefined limiting value.

According to one aspect of the present invention, it is provided that a control signal for activating an at least semi-automated vehicle is provided based on the electrical variable of the at least one component; and/or a warning signal for warning a vehicle occupant is provided based on the electrical variable of the at least one component.

The result of the check of a performance of a supply line for an electrically operated assembly, which is a service brake in particular, may thus be used for the control of the mobile platform and/or, for example, the result of an unsuccessful check may be sent as a warning signal to a driver or another vehicle occupant.

In accordance with an example embodiment of the present invention, an evaluation unit is provided, which is designed to carry out one of the above-described methods.

Using such an evaluation unit, the corresponding method may be integrated easily into different systems.

In accordance with an example embodiment of the present invention, a device is provided which includes the measuring unit, the impedance unit, and the evaluation unit.

Using such a device, which may be integrated into an assembly of the vehicle electrical system, for example, it is possible to carry out decentralized monitoring tasks with respect to parts of the vehicle electrical system.

In accordance with an example embodiment of the present invention, it is provided that the device is part of a control unit, a service brake unit, or an electrical power steering.

According to a further aspect of the present invention, a computer program is specified which includes commands which, upon the execution of the computer program by a computer, prompts the computer to carry out one of the above-described methods. Such a computer program enables the use of the described method in different systems.

In accordance with an example embodiment of the present invention, a machine-readable memory medium is specified, on which the above-described computer program is stored.

BRIEF DESCRIPTION OF THE DRAWINGS

Exemplary embodiments of the present invention are described with reference to FIG. 1 and explained in greater detail hereinafter.

DETAILED DESCRIPTION OF EXAMPLE EMBODIMENTS

The method for determining an electrical variable of at least one component of a part of the vehicle electrical system is described with reference to FIGS. 1, 2, and 3.

Figure 1:
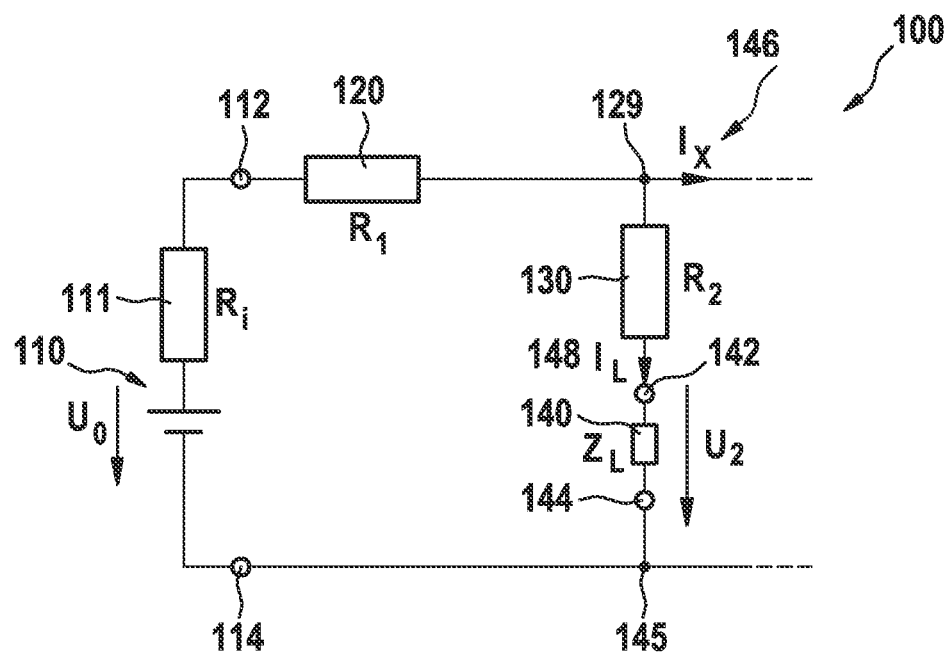
FIG. 1 shows a part of a vehicle electrical system including a supply line and an assembly.

FIG. 1 outlines a part of a vehicle electrical system 100, using which a control unit 140 of an intelligent brake (IB) is supplied with electrical power at its terminals 142, 144. Power source 110, which has a source voltage $U_0$, including its internal resistance 111 connected in series, is directly electrically connected at a first output terminal 114 to second terminal 144 of control unit 140. Second output terminal 112 of power source 110 is connected via a first supply line resistivity 120 at a neutral point 129 including a second supply line resistivity 130 to first terminal 142 of control unit 140. Control unit 140 represents the impedance unit. The power source may be designed in the form of an energy accumulator, for example a battery.

The value of supply resistance 120 includes all resistors which are active in the corresponding vehicle electrical system branch. Supply line resistivity 120 includes in particular the supply line resistivities including the contact resistances in the plug, the resistances of the cables themselves, and also ground-side supply line resistivities.

An unknown external current $I_x$ 146 also occurs at neutral point 129, which is not measured in the described method for determining an electrical variable of at least one component of the part of the vehicle electrical system. A measuring unit (not shown here) is configured to determine a plurality of voltage values between terminals 142 and 144 of control unit 140. Furthermore, the measuring unit is configured to determine a plurality of current values $I_L$ which flow through control unit 140 or impedance unit 140. Control unit 140 is configured to have at least two different operating points, for example due to brake applications of different strengths.

Electrical external current $I_x$ may flow into other control units or other components of the entire vehicle electrical system.

According to the method for determining the value of the resistance as an electrical variable of the supply line of at least one component, in the form of the sum of Ri, R1, and R2, of a part of a vehicle electrical system, a measuring unit generates a plurality of current and voltage values for each of at least two different operating points of control unit 140 and provides them to the method. Control unit 140 is controlled in such a way that it assumes these at least two different operating points. If the corresponding current and voltage values are not automatically associated with one another by the measuring unit, this takes place in an optional step of the method.

The value of the sum of Ri, R1, and R2 of the supply line is determined as follows based on a parameter estimation method and an electrical model of the part of the vehicle electrical system and at least a part of the plurality of the corresponding current and voltage values of at least two operating points of the impedance unit.

For the electrical model of the part of the vehicle electrical system, the following equation for computing a terminal voltage $U_2$ at the control unit may be formulated for the functional description:

$$U_2 = U_0 - I_x \cdot (R_1 + R_i) - I_L \cdot (R_1 + R_2 + R_i)$$

The unknown variables of the equation at point in time k may be compiled in a vector $x_k$.

$$x_k = \begin{bmatrix} R_1 + R_2 + R_i \\ U_0 - I_x \cdot (R_1 + R_i) \end{bmatrix}$$

Measured variable $z_k$ at point in time k is defined as follows:

$$z_k = U_2$$

Unknown variables $x_k$ are estimated by an online parameter estimation method, for example, a Kalman filter, by iterative model-measured variable comparison at each point in time k.

Figure 2:
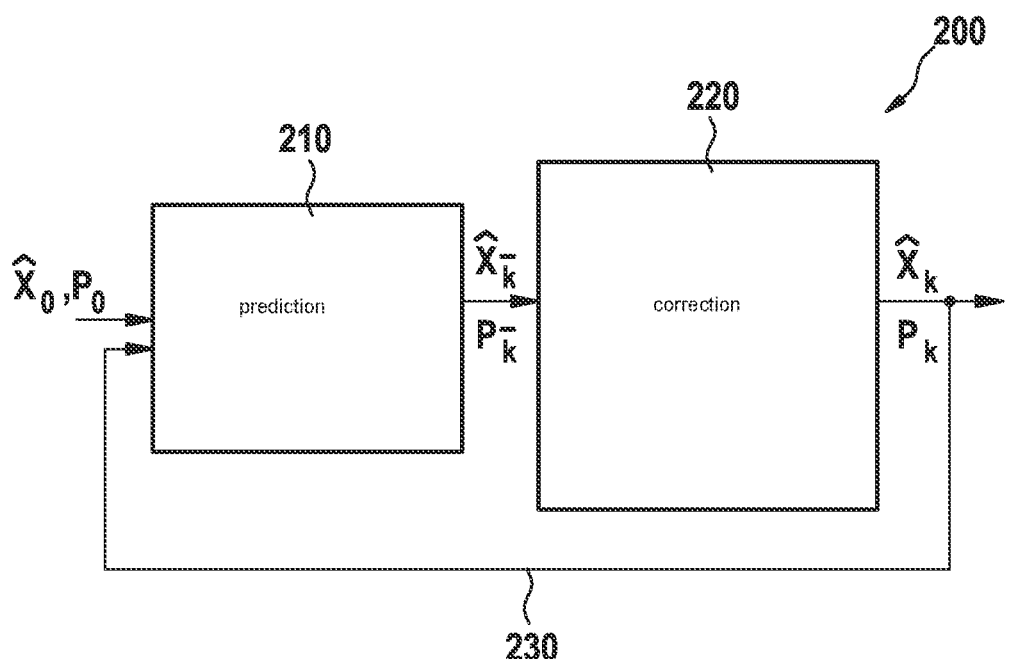
FIG. 2 shows an outline of a method for parameter estimation in accordance with an example embodiment of the present invention.

The corresponding equations for estimating $x_k$ are represented here, for example, in the form of an extended Kalman filter (EKF):

With reference to FIG. 2, an initial estimation first takes place: $\hat{x}_0$, $P_0$ This value is used as the first input value for time update (prediction) 210:

with the state prediction:

$$\hat{x}_k^- = f(\hat{x}_{k-1}, u_k)$$

and the prediction of the error covariance:

$$P_k^- = A_k P_{k-1} A_k^T + W_k Q_{k-1} W_k^T$$

=> The result: $\hat{x}_k^-$, $P_k^-$ is used for measurement update (correction) 220 as the input variable:

the calculation of the Kalman gain follows therefrom:

$$K_k = P_k^- H_k (H_k P_k^- H_k^T + V_k R_k V_k^T)$$

and thus:

the estimation update with measurement:

$$\hat{x}_k = \hat{x}_k^- + K_k [z_k - h(\hat{x}_k^-)]$$

and the update of the error covariance:

$$P_k = (I - K_k H_k) P_k^-$$

=> The result: $\hat{x}_k$, $P_k$ is given recursively 230 to time update (prediction) 210 (see above).

In these equations:

$x_k$: parameter vector (variables to be estimated)

$P_k$: covariance matrix of the estimated variables (is determined iteratively by EKF, specification of an initial matrix including high starting values).

$W_k Q_{k-1} W_k^T$: system noise matrix (parameters)

$V_k R_k V_k^T$: measurement noise matrix (parameters)

$A_k$: system matrix $H_k$: Jacobi matrix of the output function hk $Z_k$: measured variable vector $K_k$: Kalman filter gain $$x_k = \begin{bmatrix} R_1 + R_2 + R_i \\ U_0 - I_x \cdot (R_1 + R_i) \end{bmatrix}, f(\hat{x}_{k-1}, u_k) = \hat{x}_{k-1}, z_k = [U_{IB}]$$

$$h(\hat{x}_k^-) = [U_0 - I_x \cdot (R_1 + R_i) - I_{IB} \cdot (R_1 + R_2 + R_i)]$$

$$A_k = \begin{bmatrix} 1 & 0 \\ 0 & 1 \end{bmatrix}, H_k = \frac{\partial h(\hat{x}_k^-)}{\partial x_k}$$

The above-described method steps of the parameter estimation are carried out iteratively until an abortion criterion is met. One possible abortion criterion is to compare the values of one or more diagonal elements of the covariance matrix to a set threshold and to abort the parameter estimation when the set threshold is fallen below. A certain estimate accuracy of the parameter estimation may be read off with the aid of the covariance matrix, a suitable abortion condition may therefore be defined using the values of the covariance matrix. Value $\hat{x}_k$ determined by the described parameter estimation represents the sought-after sum of Ri, R1, and R2 of the resistances of the supply line.

The performance of the vehicle electrical system at the present point in time may be ascertained from the variables estimated via the Kalman filter. The smaller the sum of the Ri, R1, and R2 resistances of the supply line is, the higher is the performance.

Estimated parameter $R_1+R_2+R_i$ stands directly for the internal resistance of the control unit supply. If an upper limiting value is exceeded, a reaction of the system may take place, for example, derating the power consumption or driver warning.

The estimation of $U_0-I_x \cdot (R_1+R_i)$ approximately supplies the source voltage of battery U0 at minor current Ix. This may be used, in consideration of various boundary conditions (Ix low, DC-DC converter or generator inactive, consideration of the measuring tolerances) to assess the battery charge level, i.e., at low charge level, an action may take place, for example, a driver warning.

A reliable determination of parameters xk may only take place if at least two independent operating points were detected during operation. To ensure this, an induced current pulse may be generated in the control unit.

Figure 3:
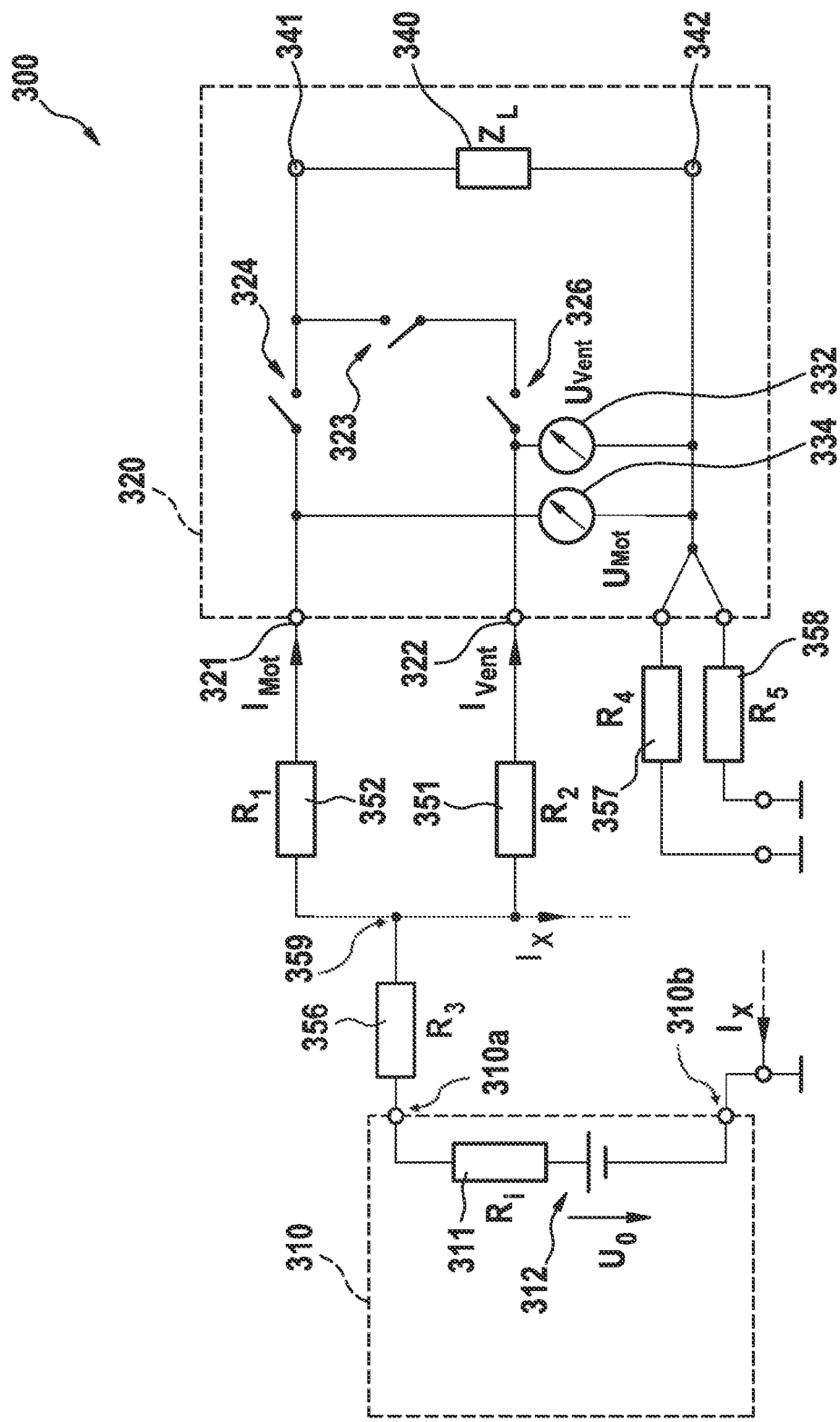
FIG. 3 shows two parts of a vehicle electrical system including shared components, in accordance with an example embodiment of the present invention.

FIG. 3 outlines a vehicle electrical system 300, which includes a first part and a second part each having electrical components, and at least one electrical component is associated with both the first part and the second part of vehicle electrical system 300. The components which are associated with both the first and the second part of vehicle electrical system 300 are power supply 310 having voltage source 310 and internal resistance 311 in series connection and a part of supply line resistivity R3 356.

Vehicle electrical system 300 schematically outlined in FIG. 3 shows an assembly 320, which is connected to an electrically conductive supply line 352 at a first terminal 321 of assembly 320 and to a second electrically conductive supply line 351 at a second terminal 322 of assembly 320, the two supply lines 351, 352 being connected to one another at a neutral point or connection 359 on the power source side within vehicle electrical system 300.

Neutral point 359 is connected via a first terminal 310a to power source 310. A second terminal 310b of the power source is connected via two ground connections 357, 358 connected in parallel to a ground terminal of assembly 320. The ground connection is designed redundantly in FIG. 3 using the two ground connections 357, 358.

Electrical assembly 320 includes a first switch 324, which is situated between first terminal 321 of assembly 320 and a load 340 of the assembly in such a way that a conductive connection may optionally be established between load 340 and first terminal 321 of assembly 320.

Electrical assembly 320 includes a second switch 326, which may establish a conductive connection between second terminal 322 and a third switch 323.

First switch 324 and second switch 326 may optionally be electrically connected to one another with the aid of third switch 323, which is contacted with first switch 324 and second switch 326 in each case on the side opposite to terminals 321, 322. Load 340 of assembly 320 is connected to second contact 310b of power source 310 with the aid of a ground connection 342. Power source 310 may be described by an ideal voltage source 312, which is connected in series via its internal resistance 311 to its first terminal 310a and its second terminal 310b of power source 310.

For the determination of a plurality of current and voltage values of the first part of the vehicle electrical system including first electrical supply line 352, an electrical connection is set up between first supply line 352 and load 340, in that first switch 324 is closed.

An electrical interruption between second supply line 351 and load 340 of assembly 320 is set up in that second switch 326 of assembly 320 is opened.

Using this connection, with the aid of first switch 324 and load 340 of assembly 320, a current is applied to first supply line 352 using power source 310, since load 340 is also connected via its ground connection 342 to second pole 310b of power source 310. Load 340 of assembly 320 has to be activated with the aid of a control circuit in order to occupy the at least three different operating points.

The example method described here may be used correspondingly to determine a plurality of current and voltage values of the second part of the vehicle electrical system, in that the current of load 340 is applied to second supply line 351, second switch 326 and third switch 323 being closed and first switch 324 being opened. The determination of the voltages and currents of second supply line 351 takes place analogously as described above.

The loaded terminal voltage of the impedance unit is determined at input 321 of first supply line 352 of assembly 320 using a voltage sensor or a voltage meter 334. At least one current is applied to first supply line 352 by the connection of load 340 with the aid of closed first switch 324 to power source 310.

An unloaded terminal voltage may be determined, for example, at input 322 of second supply line 351 of assembly 320 using a voltage sensor or voltage meter 332.

The unloaded terminal voltage may be determined at input 322 of second supply line 351 of assembly 320 using the above-described voltage sensor if a current is not applied to first supply line 352, for example, in that first switch 324 of assembly 320 is opened.

For the determination of the current, load 340 may include a current sensor or an ammeter, which determines the current applied to first supply line 352.

Both the first part of vehicle electrical system 300 includes a measuring unit 334 for the voltage and second part of vehicle electrical system 300 includes a measuring unit 332 for the voltage. Current $I_{Mot}$ in the first part of vehicle electrical system 300 and current $I_{Vent}$ in the second part of the power network may be provided either by a correspondingly designed measuring unit (not shown here) or by particular connected impedance unit $Z_L$ 340. The measurement of $I_{Mot}$ and $I_{Vent}$ may be carried out directly via a shunt or may be calculated by back-calculation from the phase currents of the EC motor used for the excitation. The one plurality of current and voltage values of electrical impedance unit $Z_L$ 340 is generated at each of at least three different operating points at the particular measuring unit and provided for the method.

The corresponding current and voltage values are associated with one another as in the above-described exemplary embodiment.

The determination of the electrical variables of the components in the parts of the vehicle electrical system is based on a modified parameter estimation method and modified electrical model of the parts of the vehicle electrical system and at least a part of the plurality of the corresponding current and voltage values of the at least three operating points. The parameter estimation method corresponds to that described above and the required modifications of the electrical model as well are described in the following.

Two equations for computing terminal voltage $U_{Mot}$ and $U_{Vent}$ at the control unit may be formulated from the electrical circuit diagram of FIG. 3:

$$U_{Mot} = U_0 - (I_x + I_{Vent}) \cdot (R_3 + R_i) - I_{Mot} \cdot (R_1 + R_3 + R_4 \| R_5 + R_i)$$

$$U_{Vent} = U_0 - (I_x + I_{Mot}) \cdot (R_3 + R_i) - I_{Vent} \cdot (R_2 + R_3 + R_4 \| R_5 + R_i)$$

The unknown variables of the equation at point in time k result here in vector xk:

$$x_k = \begin{bmatrix} R_1 \\ R_2 \\ R_3 + R_4 \| R_5 + R_i \\ U_0 - I_x \cdot (R_3 + R_i) \end{bmatrix}$$

Measured variable $z_k$ at point in time k is defined as follows:

$$z_k = \begin{bmatrix} U_{Mot} \\ U_{Vent} \end{bmatrix}$$

Output matrix $h_k$ at point in time k is defined as follows:

$$h(\hat{x}_k^-) = \begin{bmatrix} U_0 - (I_x + I_{Vent}) \cdot (R_3 + R_i) - I_{Mot} \cdot (R_1 + R_3 + R_4 \| R_5 + R_i) \\ U_0 - (I_x + I_{Mot}) \cdot (R_3 + R_i) - I_{Vent} \cdot (R_1 + R_3 + R_4 \| R_5 + R_i) \end{bmatrix}$$

Furthermore, Jacobi matrices $A_k$ and $H_k$ result as follows:

$$A_k = \begin{bmatrix} 1, 0, 0, 0 \\ 0, 1, 0, 0 \\ 0, 0, 1, 0, \\ 0, 0, 0, 1, \end{bmatrix}, H_k = \frac{\partial h(\hat{x}_k^-)}{\partial x_k}$$

Therefore, the partial wiring harnesses including resistors R1, R2 and the partial wiring harness including R3+Ri+R4∥R5 may be diagnosed separately from one another with the aid of the additional measured variable.

At least 3 linearly independent operating points are required for this purpose, which may be achieved by corresponding activation of the internal actuators. The measurement of $I_{Mot}$ and $I_{Vent}$ may be carried out directly via a shunt or may be calculated by back-calculation from the phase currents of the EC motor used for the excitation.

What is claimed is:

1. A method for determining an electrical variable of at least one component of a part of a vehicle electrical system of a vehicle, the part of the vehicle electrical system including at least one external current and an electrical impedance unit, and a measuring unit for the part of the vehicle electrical system is configured to generate a plurality of current and voltage values for each of at least two different operating points of the impedance unit, the method comprising the following steps:

activating the impedance unit to operate at each of the at least two different operating points of the impedance unit;

providing a respective plurality of current values of current flowing through the impedance unit measured at each of a first operating point of the at least two different operating points and at least one second operating point of the at least two different operating points;

providing a respective plurality of voltage values of voltages at the impedance unit measured at the first operating point and the at least one second operating point;

associating corresponding current values and voltage values of the respective pluralities of current values and the respective pluralities of voltage values with one another; and determining the at least one electrical variable of the at least one component based on a parameter estimation method and an electrical model of the part of the vehicle electrical system and at least a part of the corresponding current and voltage values of the first and the second operating points of the impedance unit;

wherein the impedance unit is part of a brake system and/or part of a power steering system.

2. A method for determining an electrical variable of at least one component of at least one part of a vehicle electrical system, wherein the vehicle electrical system includes at least a first part and a second part including respective electrical components, and at least one electrical component is associated with both the first part and the second part of the vehicle electrical system, and each of the first part and the second part of the vehicle electrical system includes a respective measuring unit, which generates a plurality of current and voltage values of the electrical impedance unit at each of at least three different operating points of the impedance unit at the respective measuring unit, the method comprising:

activating the impedance unit to operate at each of the at least three different operating points of the impedance unit;

providing a respective plurality of current values of current flowing through the impedance unit measured at each of a first operating point of the at least three operating points, a second operating point of the at least three operating points, and at least a third operating point, at each of the respective measuring units;

providing a respective plurality of voltage values of voltages at the impedance unit measured at each of the first operating point, the second operating point, and the at least third operating point, at each of the respective measuring units;

associating corresponding current and voltage values of the respective pluralities of current values and the respective pluralities of voltage values with one another; and determining the electrical variable of the at least one component in the at least one part of the vehicle electrical system based on a modified parameter estimation method, and a modified electrical model of the parts of the vehicle electrical system, and at least a part of the corresponding current and voltage values of the at least three operating points;

wherein the impedance unit is part of a brake system and/or part of a power steering system.

3. The method as recited in claim 1, wherein the parameter estimation method is based on a Kalman filter, or an extended Kalman filter, or an unscented Kalman filter, or a recursive least-squares method, or a particle filter.

4. The method as recited in claim 1, wherein the at least one component is a supply line resistivity of the impedance unit.

5. The method as recited in claim 1, wherein the impedance unit is an electrical load of the vehicle electrical system.

6. The method as recited in claim 1, wherein the impedance unit is controlled in each of the first and second operating point to determine the electrical variable of the at least one component of the part of the vehicle electrical system.

7. The method as recited in claim 1, wherein the electrical variable of the vehicle electrical system is transmitted to a central evaluation unit including a computer for monitoring the at least one component.

8. The method as recited in claim 1, wherein: (i) a control signal for activating an at least semi-automated vehicle is provided based on the electrical variable of the at least one component, and/or (ii) a warning signal for warning a vehicle occupant is provided based on the electrical variable of the at least one component.

9. An evaluation unit including a computer configured to determine an electrical variable of at least one component of a part of a vehicle electrical system of a vehicle, the part of the vehicle electrical system including at least one external current and an electrical impedance unit, and a measuring unit for the part of the vehicle electrical system is configured to generate a plurality of current and voltage values for each of at least two different operating points of the impedance unit, the evaluation unit configured to:
- activate the impedance unit to operate at each of the at least two different operating points of the impedance unit;
- receive a respective plurality of current values of current flowing through the impedance unit measured at each of a first operating point of the at least two different operating points and at least one second operating point of the at least two different operating points;
- receive a respective plurality of voltage values of voltages at the impedance unit measured at the first operating point and the at least one second operating point;
- associate corresponding current values and voltage values of the respective pluralities of current values and the respective pluralities of voltage values with one another; and
- determine the at least one electrical variable of the at least one component based on a parameter estimation method and an electrical model of the part of the vehicle electrical system and at least a part of the corresponding current and voltage values of the first and the second operating points of the impedance unit;
- wherein the impedance unit is part of a brake system and/or part of a power steering system.

10. A device, comprising:
a measuring unit;
an electrical impedance unit; and
an evaluation unit evaluation unit including a computer configured to determine an electrical variable of at least one component of a part of a vehicle electrical system of a vehicle, the part of the vehicle electrical system including at least one external current and the electrical impedance unit, wherein the measuring unit is configured to generate a plurality of current and voltage values for each of at least two different operating points of the impedance unit, the evaluation unit configured to:
- activate the impedance unit to operate at each of the at least two different operating points of the impedance unit;
- receive a respective plurality of current values of current flowing through the impedance unit measured at each of a first operating point of the at least two different operating points and at least one second operating point of the at least two different operating points;
- receive a respective plurality of voltage values of voltages at the impedance unit measured at the first operating point and the at least one second operating point;
- associate corresponding current values and voltage values of the respective pluralities of current values and the respective pluralities of voltage values with one another; and
- determine the at least one electrical variable of the at least one component based on a parameter estimation method and an electrical model of the part of the vehicle electrical system and at least a part of the corresponding current and voltage values of the first and the second operating points of the impedance unit;
- wherein the impedance unit is part of a brake system and/or part of a power steering system.

11. The device as recited in claim 10, wherein the device is part of a control unit, or a braking unit, or an electrical power steering.

12. A non-transitory machine-readable storage medium on which is stored a computer program for determining an electrical variable of at least one component of a part of a vehicle electrical system of a vehicle, the part of the vehicle electrical system including at least one external current and an electrical impedance unit, and a measuring unit for the part of the vehicle electrical system is configured to generate a plurality of current and voltage values for each of at least two different operating points of the impedance unit, the computer program, when executed by a computer, causing the computer to perform the following steps:
- activating the impedance unit to operate at each of the at least three different operating points of the impedance unit;
- providing a respective plurality of current values of current flowing through the impedance unit measured at each of a first operating point of the at least two different operating points and at least one second operating point of the at least two different operating points;
- providing a respective plurality of voltage values of voltages at the impedance unit measured at the first operating point and the at least one second operating point;
- associating corresponding current values and voltage values of the respective pluralities of current values and the respective pluralities of voltage values with one another; and
- determining the at least one electrical variable of the at least one component based on a parameter estimation method and an electrical model of the part of the vehicle electrical system and at least a part of the corresponding current and voltage values of the first and the second operating points of the impedance unit;
- wherein the impedance unit is part of a brake system and/or part of a power steering system.

13. The method as recited in claim 1, wherein the impedance unit is a service brake of the vehicle.

14. The method as recited in claim 2, wherein the impedance unit is a service brake of the vehicle.

15. The method as recited in claim 1, wherein, the activating step including activating the impedance unit using pulsed current.

16. The method as recited in claim 2, wherein, the activating step including activating the impedance unit using pulsed current.

\* \* \* \* \*